(12) United States Patent
Cargill

(10) Patent No.: US 12,151,933 B2
(45) Date of Patent: Nov. 26, 2024

(54) COMB-DRIVE DEVICE USED IN MICRO ELECTRO MECHANICAL SYSTEM

(71) Applicant: AAC ACOUSTIC TECHNOLOGIES (SHENZHEN) CO., LTD., Shenzhen (CN)

(72) Inventor: Scott Lyall Cargill, Edinburgh (GB)

(73) Assignee: AAC ACOUSTIC TECHNOLOGIES (SHENZHEN) CO., LTD., Shenzhen (CN)

(*) Notice: Subject to any disclaimer, the term of this patent is extended or adjusted under 35 U.S.C. 154(b) by 812 days.

(21) Appl. No.: 17/202,366

(22) Filed: Mar. 16, 2021

(65) Prior Publication Data
US 2022/0298004 A1    Sep. 22, 2022

(51) Int. Cl.
*B81B 3/00* (2006.01)
*B81B 7/02* (2006.01)
*H02N 1/00* (2006.01)

(52) U.S. Cl.
CPC .............. *B81B 3/0021* (2013.01); *B81B 7/02* (2013.01); *H02N 1/008* (2013.01); *B81B 2201/033* (2013.01)

(58) Field of Classification Search
None
See application file for complete search history.

(56) References Cited

U.S. PATENT DOCUMENTS

| | | | | |
|---|---|---|---|---|
| 4,943,750 A | * | 7/1990 | Howe | H02N 1/004 310/309 |
| 7,619,497 B2 | * | 11/2009 | Yuba | H01H 59/0009 335/78 |
| 2005/0062361 A1 | * | 3/2005 | Harley | H02N 1/008 310/309 |
| 2012/0206785 A1 | * | 8/2012 | Sourani | B81B 3/0043 359/221.3 |
| 2019/0031499 A1 | * | 1/2019 | Pregl | B81C 1/00166 |

* cited by examiner

*Primary Examiner* — Bernard Rojas
(74) *Attorney, Agent, or Firm* — W&G Law Group

(57) ABSTRACT

A comb-drive device used in Micro Electro Mechanical System is provided, and the comb-drive device includes: a rotor comprising a rotor body and a plurality of rotor combs provided on the rotor body; and a stator comprising one or more stator bodies and a plurality of stator combs provided on the one or more stator bodies. The rotor is spaced from the stator by a distance, the rotor and the stator are arranged along a direction in which the rotor is movable, and the plurality of rotor combs and the plurality of stator combs are alternately arranged in a direction particular to the direction in which the rotor is movable; and the rotor body is made of an insulating material, and each of the plurality of rotor combs is made of a conductive material or coated with a conductive material. The present invention can increase sensitivity and capacitance efficiency of the comb-drive device.

12 Claims, 12 Drawing Sheets

Single ended, circular plate

Single ended, square

COMB-DRIVE DEVICE USED IN MICRO ELECTRO MECHANICAL SYSTEM

TECHNICAL FIELD

The present invention relates to the technical field of Micro Electro Mechanical Systems, and more particularly, to a comb-drive device used in Micro Electro Mechanical System.

BACKGROUND

Comb-drive devices are a type of actuators that can be used to manage creation and flow of electrostatic forces that are generated between a set of devices known as combs. The proper alignment of the combs in the drive help to generate this energy that in turn can be used in a number of manufacturing applications, for example, (Micro Electro Mechanical System) MEMS applications.

Usually, a comb-drive device includes a moving element (rotor) and a fixed element (stator). The rotor includes a rotor body and a plurality of rotor combs provided on the rotor body, and the stator includes a stator body and a plurality of stator combs provided on the stator body. Generally, the rotor body may be a proof mass, cantilever or diaphragm. Displacement of the rotor causes a displacement of the rotor combs relative to the stator combs. An electrostatic bias is applied across the rotor-stator gap. The displacement causes an output voltage on the comb to vary proportionate to the displacement/pressure. Comb-drive devices have a particular advantage to MEMS microphones in that the combs can be arranged to give a sliding motion relative to each other, instead of a squeezing motion as seen in most parallel plate type microphones. This lowers viscous damping and increases acoustic SNR of the device. Moreover, in the realm of differential signaling for MEMS devices, two opposite polarity signals can be extracted from the device and then combined to provide an output signal that is much larger than an output signal in a case of a single ended device, and this also can drive higher system SNR.

However, for the comb-drive devices in the related art, there are following limitations/disadvantages.

1. The rotor body, rotor combs, stator body and stator combs are usually made from a common material, which is polysilicon. This allows for a simplified process and makes it easy to electrically connect the device to supporting electronics. However, with such configuration, the entire structure is biased. This results in large stray capacitances in those parts of the structure outside of the combs, which should be the sensing element.

2. Usually, for the comb-drive devices, there are some sections where the bias is applied normal to the displacement of the device, this will result in an electrostatic force acting in the same axis as the displacement and will lower the pull in of the device.

3. The material of polysilicon has a yield strength of 3 to 5 GPa, which makes some of the requirements around mechanical reliability in drop test very challenging.

4. The use of a single, common material for all elements of the device imposes limitations on the process steps that can make a viable differential signal output—particularly in terms of arranging more than one bias voltage on a common electrical connection as would be the case with a fully polysilicon structure, and in terms of arranging the structure to allow for comb elements to have the correct orientation for differential sensing.

SUMMARY

In order to solve or ameliorate the problems or disadvantages in the related art, the present invention provides a comb-drive device used in Micro Electro Mechanical System, so as to increase sensitivity and capacitance efficiency of the comb-drive device.

In a first aspect, an embodiment of the present invention provides a comb-drive device used in Micro Electro Mechanical System, and the device includes: a rotor including a rotor body and a plurality of rotor combs provided on the rotor body; and a stator including one or more stator bodies and a plurality of stator combs provided on the one or more stator bodies. The rotor is spaced from the stator by a distance, the rotor and the stator are arranged along a direction in which the rotor is movable, and the plurality of rotor combs and the plurality of stator combs are alternately arranged in a direction particular to the direction in which the rotor is movable; and the rotor body is made of an insulating material, and each of the plurality of rotor combs is made of a conductive material or coated with a conductive material.

As an improvement, the insulating material is Silicon Nitride or Silicon Carbide.

As an improvement, the conductive material is polysilicon, metal, or titanium nitride.

As an improvement, the rotor body is a diaphragm or a cantilever.

As an improvement, each of the one or more stator bodies is made of a conductive material or an insulating material.

As an improvement, the conductive material of the one or more stator bodies is different from the conductive material of the rotor combs.

As an improvement, the insulating material of the one or more stator bodies is different from the insulating material of the rotor body.

As an improvement, each of the plurality of stator combs is made of a conductive material.

As an improvement, the conductive material of the plurality of stator combs is different of the conductive material of the rotor combs.

As an improvement, a distance between each of the plurality of rotor combs and one stator comb of the plurality of rotor combs adjacent to the rotor comb ranges from 1 μm to 3 μm, a distance between adjacent rotor combs of the plurality of rotor combs ranges from 6 μm to 10 μm, a distance between adjacent stator combs of the plurality of stator combs ranges from 6 μm to 10 μm, and a distance between the rotor body and each of the plurality of stator combs arrange form 3 μm to 6 μm.

As an improvement, a projection of each of the plurality of rotor combs onto a plane of the rotor body is parallel to a perimeter of the rotor body or follows a radius of the rotor body.

As an improvement, a projection of each of the plurality of stator combs onto a plane of the rotor body is parallel to a perimeter of the rotor body or follows a radius of the rotor body.

As an improvement, each of the plurality of stator combs has a width of 3 μm and a height of 5 μm.

The technical solution of the present invention can bring the following technical effects.

With the above-mentioned comb-drive device, the present invention can bring the following benefits. 1) By isolating and segregating the comb pairs, it becomes possible to realize differential sensing since sections of combs on the same rotor body 1 or stator body 3 can be biased to different polarities and magnitudes from each other. 2) By isolating and segregating the comb pairs, an electrostatic field is formed only in a gap between combs and not in the diaphragm above or below the combs, therefore, an electrostatic force is formed only in a direction that is perpendicular to a displacement direction of the diaphragm, so a larger electrostatic force can be applied through a larger bias without causing device failure due to pull in instabilities. 3) The material of the rotor body 1 has high yield strength, thereby increasing a margin of safety for mechanical reliability significantly. 4) Multiple materials are used for different elements: the rotor body 1, the rotor combs 2, the stator body 3 and the stator combs 4, therefore, a larger scope is made for choosing the materials, thereby optimizing their complimentary qualities in process (for example, choosing materials with high etch selectivity with respect to each other). 5) By arranging the combs in such a manner that a projection of each comb runs parallel to the perimeter of the rotor body 1, mechanical compliance of the device can be maximized, thereby ensuring a high sensitivity output. 6) With only the combs biased, there is far less stray, parasitic capacitance. Therefore, sensitivity and capacitance efficiency is increased.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

REFERENCE SIGNS

RT—rotor;
   1—rotor body;
   2—rotor comb;
     20—thin film;
ST—stator;
   3, 3'—stator body
   4—stator comb The drawings herein are incorporated into and constitute a part of the present specification, illustrate embodiments of the present invention and explain principles of the present invention together with the specification.

DESCRIPTION OF EMBODIMENTS

The technical solutions in the embodiments of the present invention are described in the following with reference to the accompanying drawings. It should be noted that, the described embodiments are merely exemplary embodiments of the present invention, which shall not be interpreted as providing limitations to the present invention. All other embodiments obtained by those skilled in the art without creative efforts according to the embodiments of the present invention are within the scope of the present invention.

Figure 1:
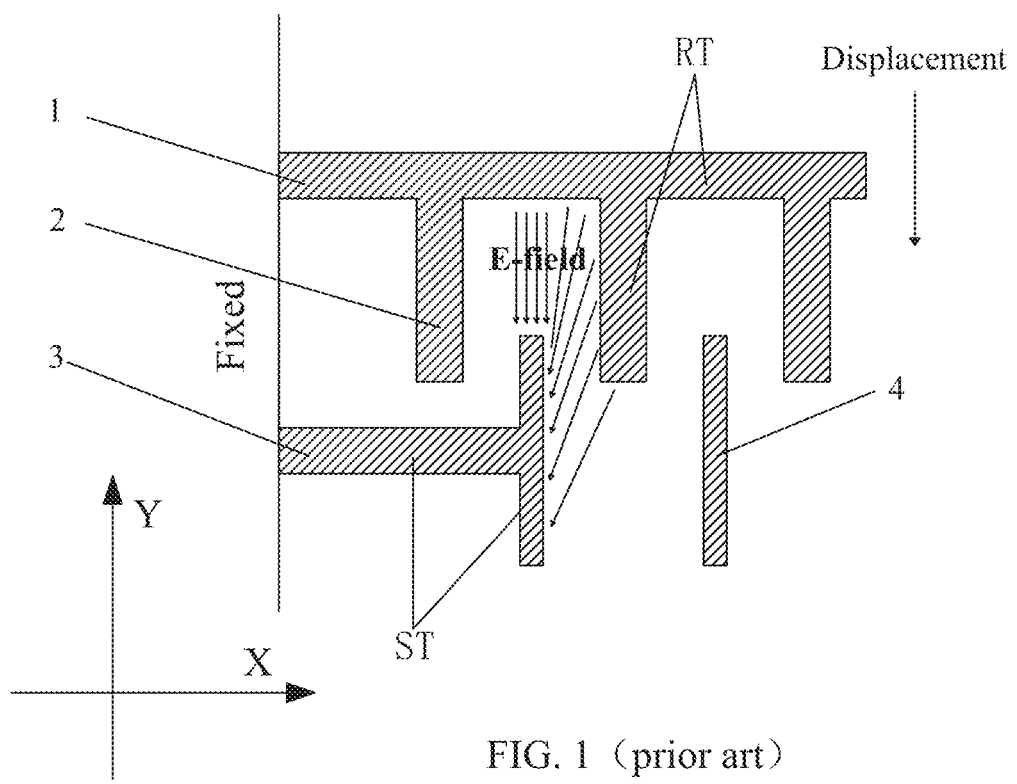
FIG. 1 is a schematic diagram of a structure of a comb-drive device in the related art.

FIG. 1 is a schematic diagram of a structure of a comb-drive device in the related art. As shown in FIG. 1, in the related art, the comb-drive device includes: a rotor RT including a rotor body 1 and rotor combs 2; and a stator ST including a stator body 3 and stator combs 4. Since the rotor RT and the stator ST are made of a same material, an electrostatic field is formed not only between a gap between the rotor combs 2 and the stator combs 4, but also between the rotor body 1 and the stator combs 4 (as shown in FIG. 1). As a result, the entire structure is biased. This results in large stray capacitances in those parts of the structure outside of the combs, which should be the sensing element.

Figure 2A:
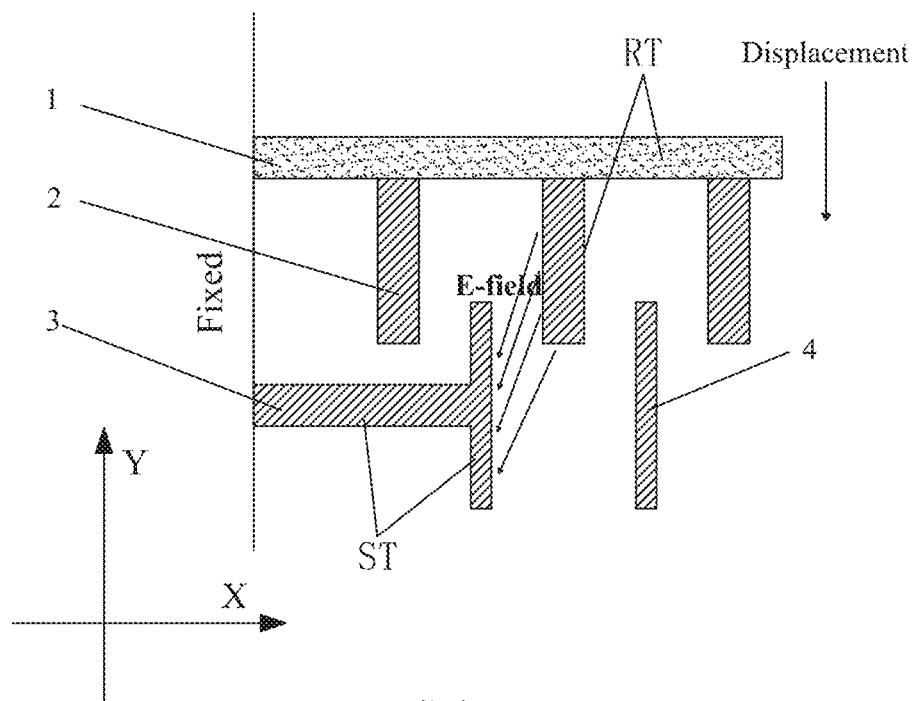
FIG. 2A is a schematic diagram of a structure of a comb-drive device provided by an embodiment of the present invention.

In order to solve the above-mentioned problem, an embodiment of the present invention provides a comb-drive device used in Micro Electro Mechanical System. In this embodiment, as shown in FIG. 2A, the comb-drive device includes: a rotor RT including a rotor body 1 and a plurality of rotor combs 2 provided on the rotor body 1; and a stator ST including a stator body 3 and a plurality of stator combs 4 provided on the stator body 3. The rotor RT is spaced from the stator ST by a distance. The rotor RT and the stator ST are arranged along a direction Y, and the rotor RT is movable along the direction Y. The plurality of rotor combs 2 and the plurality of stator combs 4 are alternately arranged in a direction Y, which is particular to the direction X. The rotor body 1 is made of an insulating material, and each of the rotor combs 2 is made of a conductive material or coated with a conductive material.

In an embodiment, the insulating material of the rotor body 1 has high yield strength, thereby significantly increasing a margin of safety for mechanical reliability.

In an embodiment, the insulating material may be Silicon Nitride, Silicon Carbide, etc., and the conductive material may be polysilicon, metal, or titanium nitride.

Each of the plurality of stator combs is made of a conductive material.

In an embodiment, the stator body 3 may be made of a conductive material or insulating material. If the stator body 3 is made of a conductive material, the conductive material of the stator body 3 may be different from the conductive material of the stator comb 4.

Figure 2B:
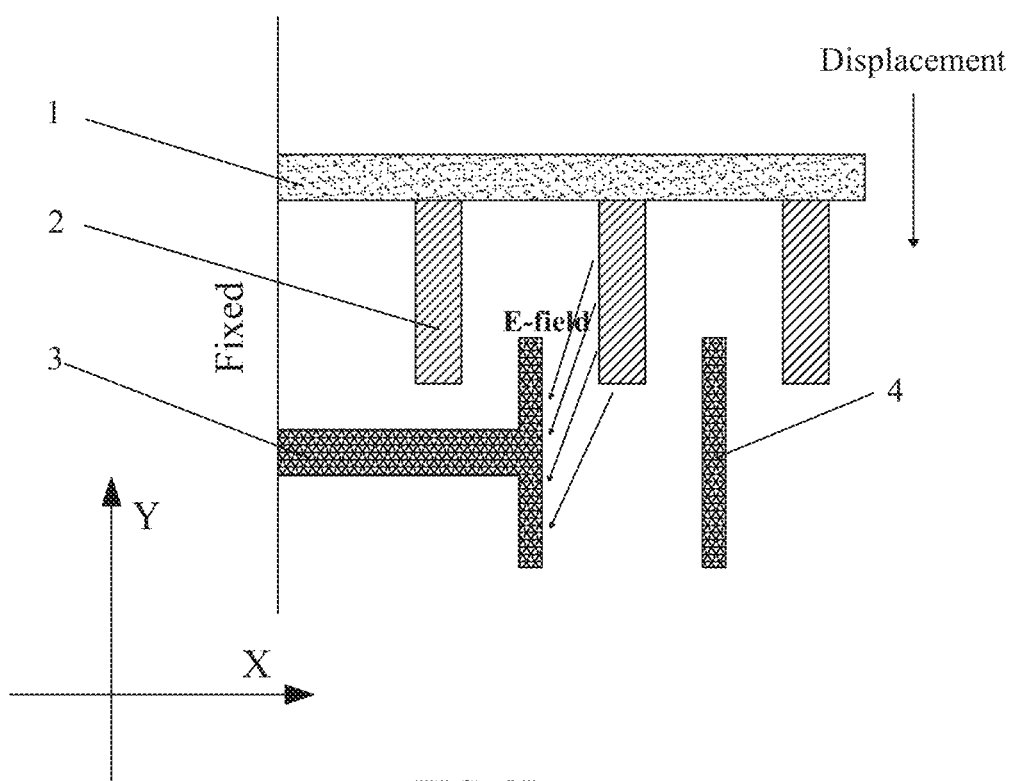
FIG. 2B is a schematic diagram of a structure of a comb-drive device provided by another embodiment of the present invention.

In an embodiment, the conductive material of the rotor comb 2 may be the same as the conductive material of the stator comb 4 (as shown in FIG. 2A), or may be different from the conductive material of the stator comb 4 (as shown in FIG. 2B).

Figure 8:
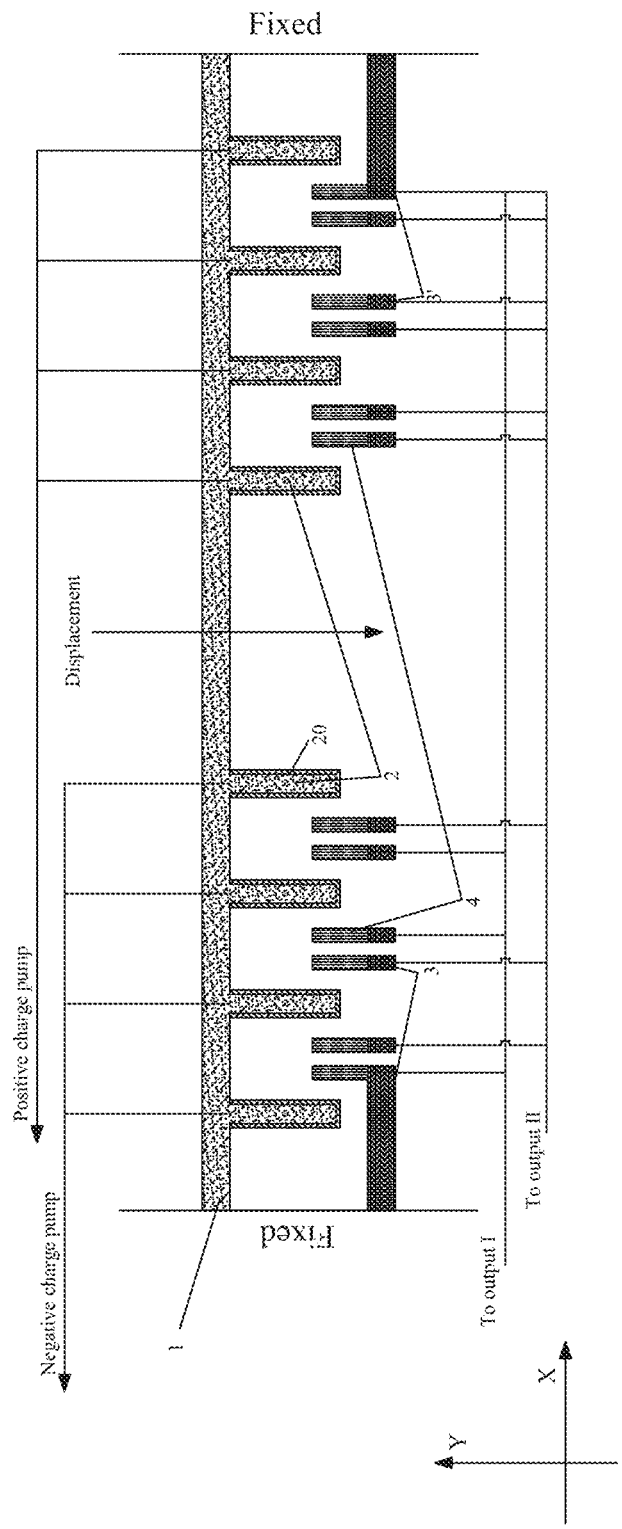
FIG. 8 is a schematic diagram of a structure of a comb-drive device provided by still another embodiment of the present invention.

Further, in an embodiment, the material of the rotor body 1, the material of the rotor comb 2, the material of the stator body 3, and the material of the stator comb 4 may be all different from one another, as shown in FIG. 8.

With this configuration, multiple materials can be used for different elements: rotor body, rotor combs, stator combs and stator body. In this way, a larger scope is made for choosing the materials, thereby optimizing their complimentary qualities in process (for example, choosing materials with high etch selectivity with respect to each other). Moreover, an electrostatic force exists only between the rotor combs 2 and the stator combs 4, not between the rotor body 1 and the stator combs 4. Therefore, no large stray capacitances in those parts of the structure outside of the combs will be formed, thereby increasing sensitivity and capacitance efficiency of the comb-drive device.

Figure 3:
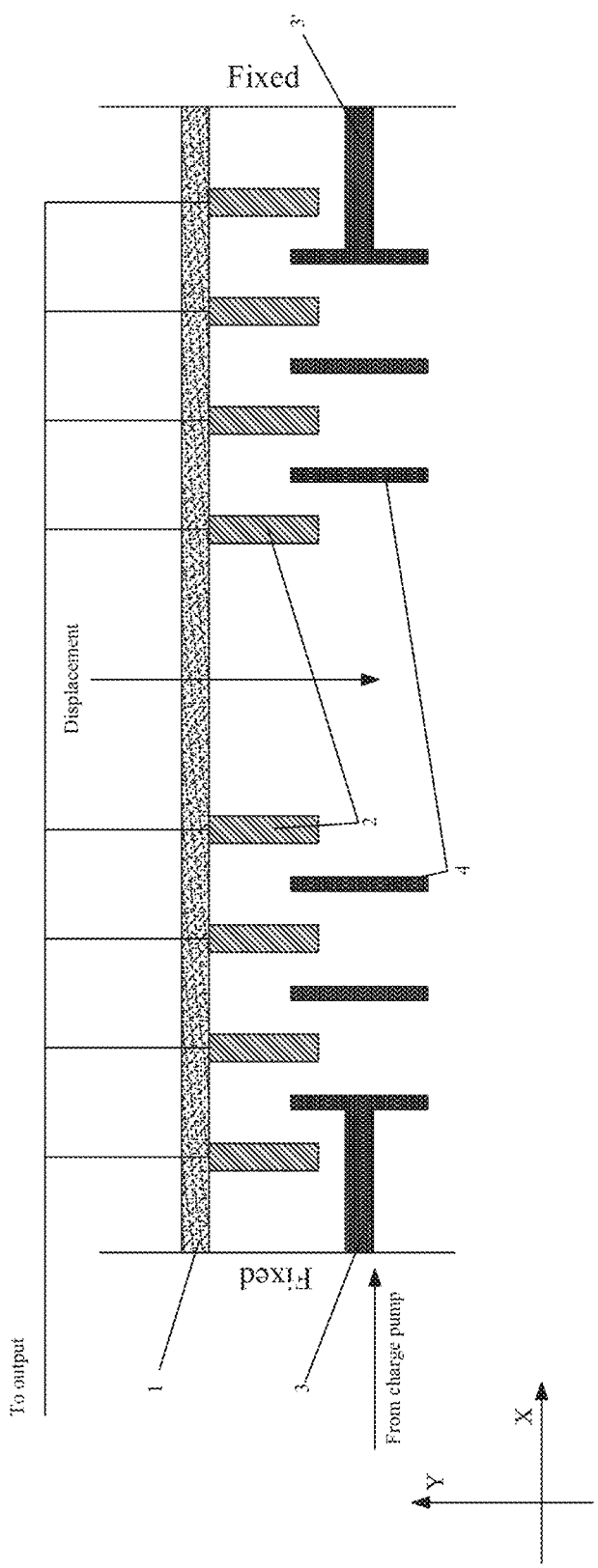
FIG. 3 is a schematic diagram of a structure of a comb-drive device provided by still another embodiment of the present invention.

In an embodiment, as shown in FIG. 3, two stator bodies, which are a stator body 3 and a stator body 3', are provided respectively at two sides of the comb-drive device, and the stator body 3 and stator body 3' are connected to a same charge pump. In an implementation manner, the stator body 1 is a proof mass, a cantilever or a diaphragm. As shown in FIG. 3, two ends of the rotor body 1 are fixed, and an end of each of the two stator bodies 3, 3' is fixed. And each of the rotor combs 2 is connected to a same output. The comb-drive device as shown FIG. 3 is configured for single ended output, and the stator body and the stator combs are made of a same material.

Figure 4:
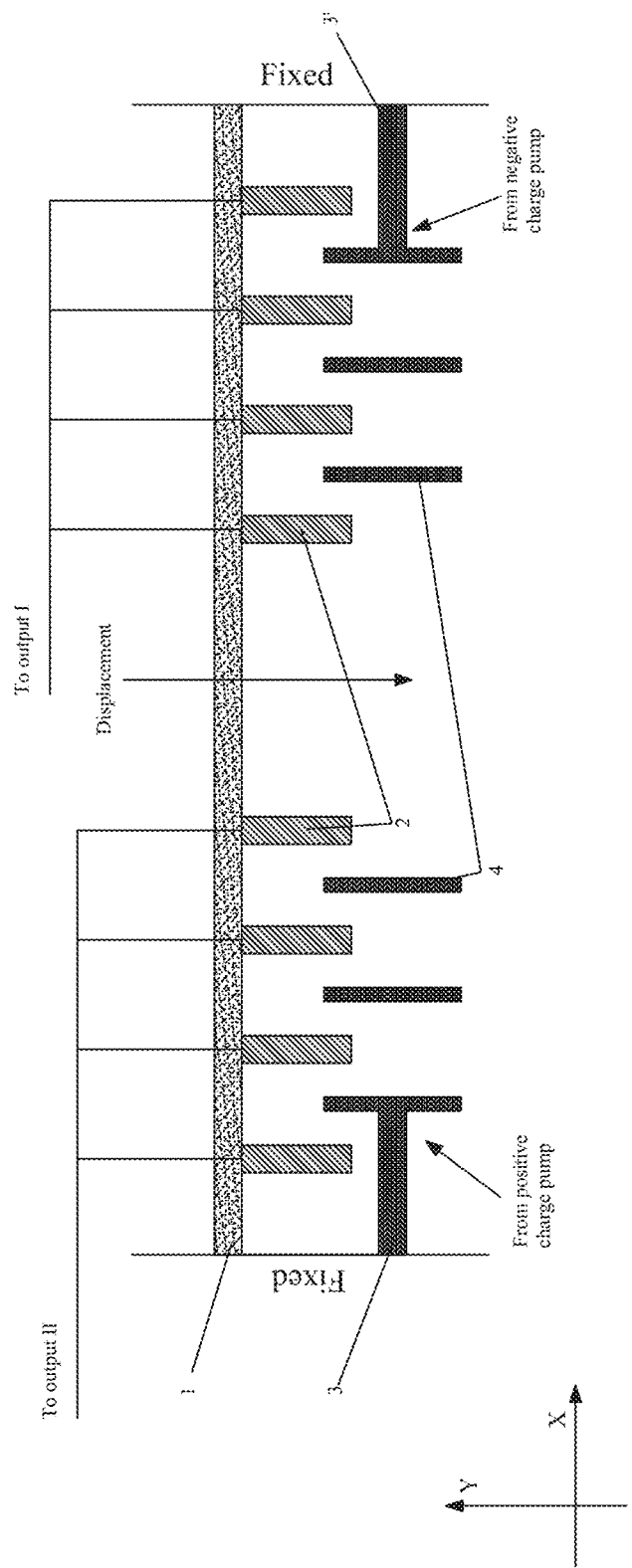
FIG. 4 is a schematic diagram of a structure of a comb-drive device provided by still another embodiment of the present invention.

In another embodiment, as shown in FIG. 4, two stator bodies 3, 3' are provided respectively at two sides of the comb-drive device, the stator body 3 is connected to a positive charge pump, and the stator body 3' is connected to a negative charge pump. The rotor combs 2, which cooperate with the stator combs 4 disposed at a same side with the stator body 3, are connected to an output II. The rotor combs 2, which cooperate with the stator combs 4 disposed at a same side with the stator body 3', are connected to an output I. It should be noted that, the output I and the output II herein are merely for distinguishing the outputs from one another, not for limiting a specific connection relation thereof. The comb-drive device as shown FIG. 4 is configured for differential output, and the stator body and the stator combs are made of a same material.

Figure 5:
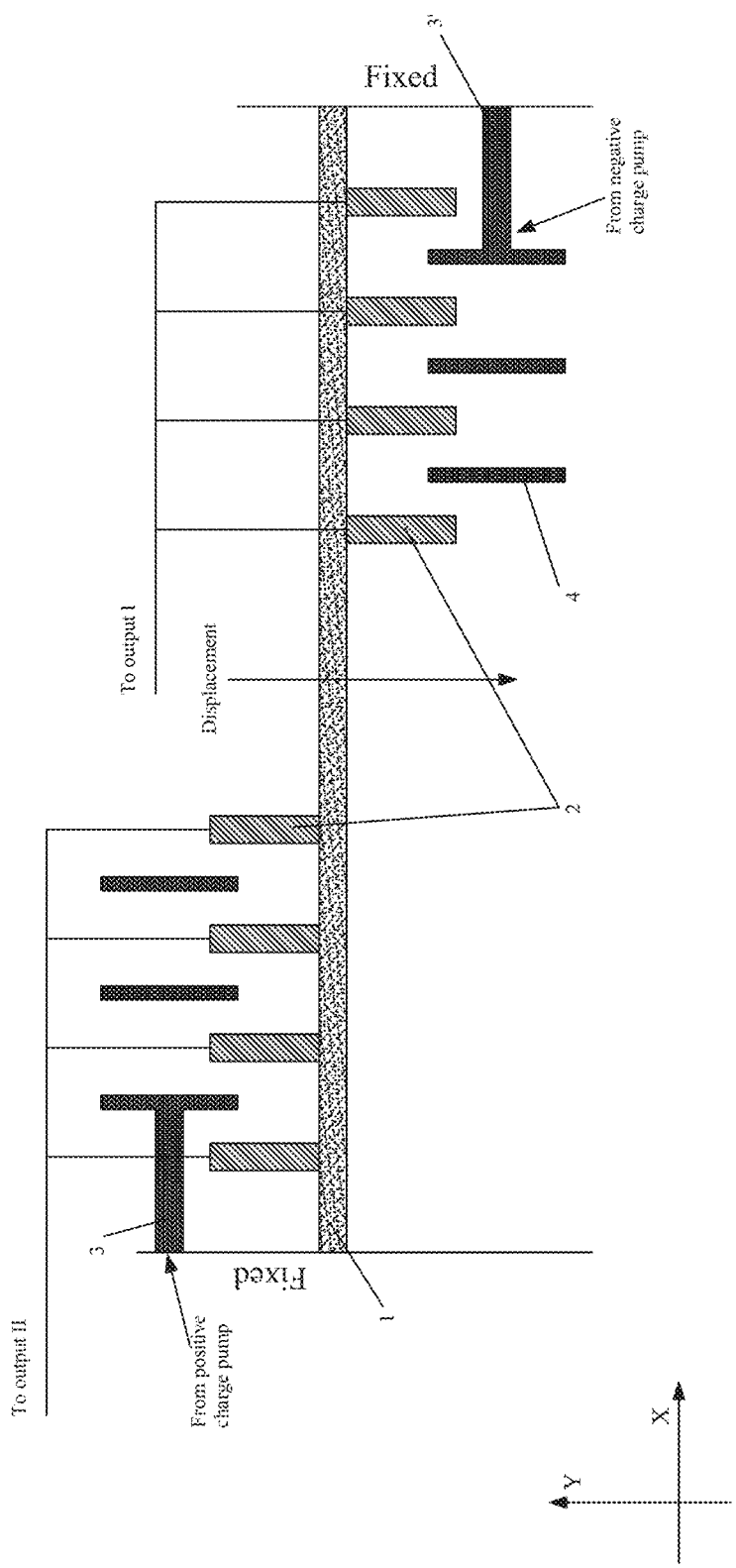
FIG. 5 is a schematic diagram of a structure of a comb-drive device provided by still another embodiment of the present invention.

In an embodiment, as shown in FIG. 5, two stator bodies 3, 3' are provided respectively at two sides of the comb-drive device, the stator body 3 is connected to a positive charge pump, and the stator body 3' is connected to a negative charge pump. The stator body 3 and the stator bombs 4 disposed at a same side with the stator body 3 are disposed above the rotor, and the stator body 3' and the stator bombs 4 disposed at a same side with the stator body 3' are disposed above the rotor. Accordingly, the rotor combs 2, which cooperate with the stator combs 4 disposed at a same side with the stator body 3, are disposed an upper side of the rotor body 1; and the rotor combs 2, which cooperate with the stator combs 4 disposed at a same side with the stator body 3', are disposed a lower side of the rotor body 1. The comb-drive device as shown FIG. 5 is configured for differential output, and the stator body and the stator combs are made of a same material.

Figure 6:
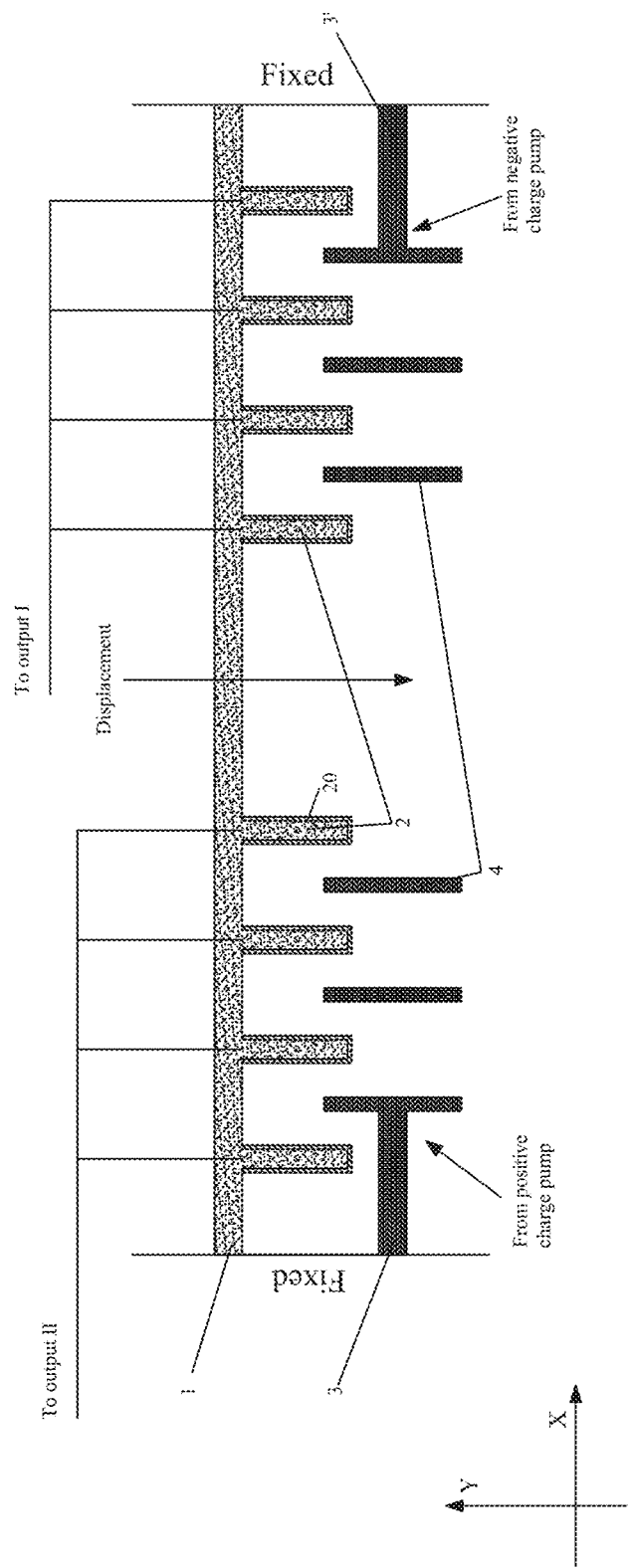
FIG. 6 is a schematic diagram of a structure of a comb-drive device provided by still another embodiment of the present invention.

In an embodiment, as shown in FIG. 6, each of the plurality of rotor combs 2 may be made by an insulating material coated with a conductive material. The coated material may be formed as a thin film 20. The comb-drive device as shown FIG. 6 is configured for differential output, and the stator body and the stator combs are made of a same material. The insulating material may be Silicon Nitride, Silicon Carbide, etc. The conductive material may be polysilicon, metal, titanium nitride, etc.

Figure 7:
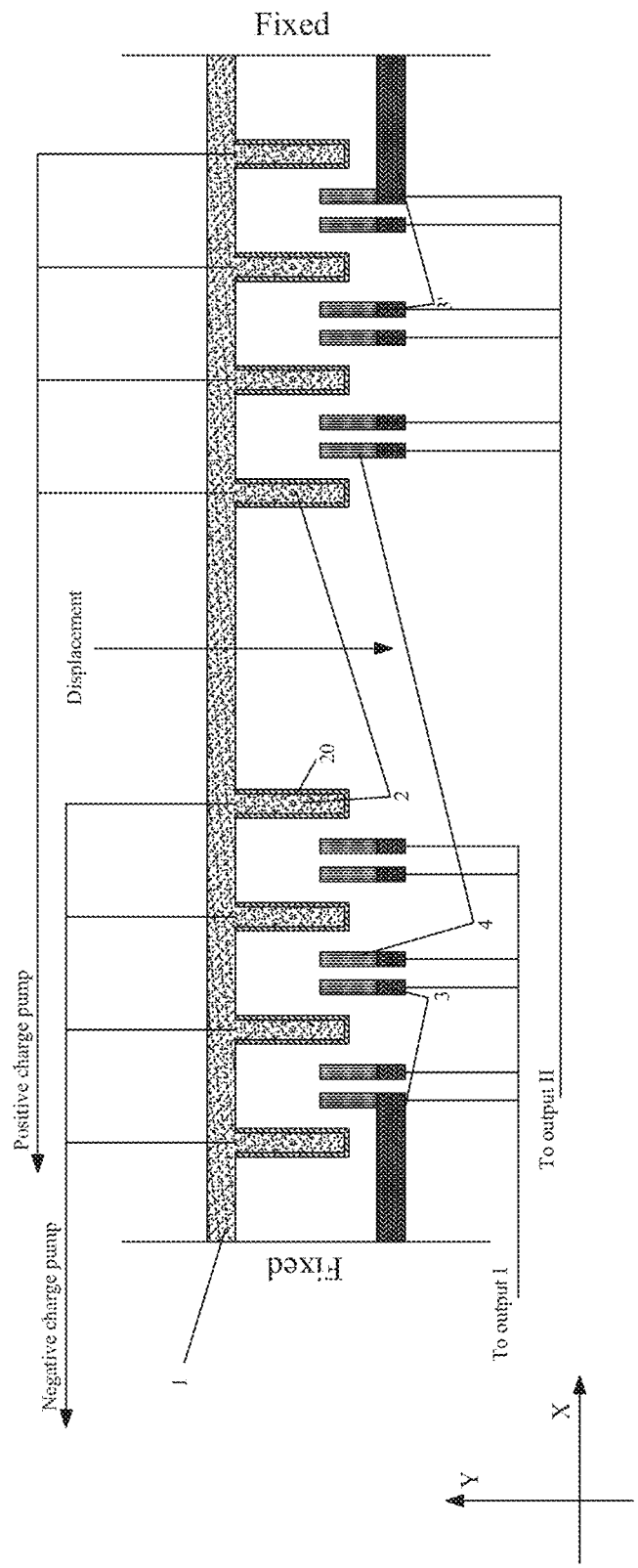
FIG. 7 is a schematic diagram of a structure of a comb-drive device provided by still another embodiment of the present invention.

In an embodiment, as shown in FIG. 7, each of the plurality of rotor combs 2 may be made by an insulating material coated with a conductive material. The comb-drive device as shown FIG. 7 is configured for differential output, and the material of the stator body is different from the material of the stator combs. In an embodiment, the material of the stator body is an insulating material, and the material of the stator combs is a conductive material. The insulating material may be Silicon Nitride, Silicon Carbide, etc. The conductive material may be polysilicon, metal, titanium nitride, etc. In an embodiment, each stator comb 4 includes two sub-combs. As shown in FIG. 7, each rotor comb 2 at one side of the comb-drive device is connected to the negative charge pump, and each comb 2 at the other side of the comb-drive device is connected to the positive charge pump. Accordingly, the stator combs 4, which are disposed at a same side with the rotor combs 2 that are connected to the negative charge pump, are connected to output I, and the stator combs 4, which are disposed at a same side with the rotor combs 2 that are connected to the positive charge pump, are connected to output II.

In an embodiment, as shown in FIG. 8, each of the plurality of rotor combs 2 may be made by an insulating material coated with a conductive material. The comb-drive device as shown FIG. 8 is configured for differential output, and the material of the stator body is different from the material of the stator combs. In an embodiment, the material of the stator body is an insulating material, and the material of the stator combs is a conductive material. The insulating material may be Silicon Nitride, Silicon Carbide, etc. The conductive material may be polysilicon, metal, titanium nitride, etc. In an embodiment, each stator comb includes two sub-combs. As shown in FIG. 8, each rotor comb 2 at one side of the comb-drive device is connected to the negative charge pump, and each comb 2 at the other side of the comb-drive device is connected to the positive charge pump. Accordingly, each stator comb 4 includes two sub-combs, one of the two sub-combs is connected to output I, and the other one of the two sub-combs is connected to output II.

In an embodiment, a distance between each of the plurality of rotor combs and one stator comb of the plurality of rotor combs adjacent to the rotor comb ranges from 1 μm to 3 μm, a distance between adjacent rotor combs of the plurality of rotor combs ranges from 6 μm to 10 μm, a distance between adjacent stator combs of the plurality of stator combs ranges from 6 μm to 10 μm, and a distance between the rotor body and each of the plurality of stator combs arrange form 3 μm to 6 μm.

Figure 9:
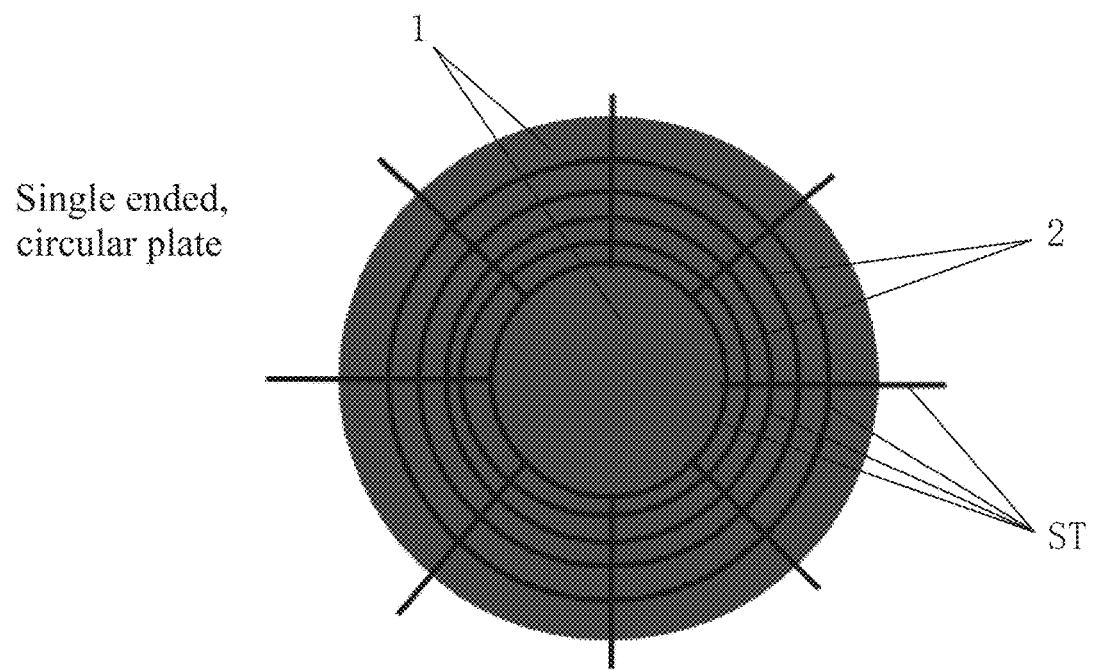
FIG. 9 is a top view of a comb-drive device provided by an embodiment of the present invention.

In an embodiment, as shown in FIG. 9, which illustrates a top view of a comb-drive device provided by an embodiment of the present invention, the rotor body has a circular shape, and the comb-drive device is configured for single ended output. In this embodiment, a projection of each of the plurality of rotor combs 2 onto a plane of the rotor body 1 is parallel to a perimeter of the rotor body 1 or follows a radius of the rotor body, and a projection of each of the plurality of stator combs 4 onto the plane of the rotor body 1 is parallel to a perimeter of the rotor body 1 or follows a radius of the rotor body 1. Optionally, each of the plurality of stator combs has a width of 3 µm and a height of 5 µm.

Figure 10:
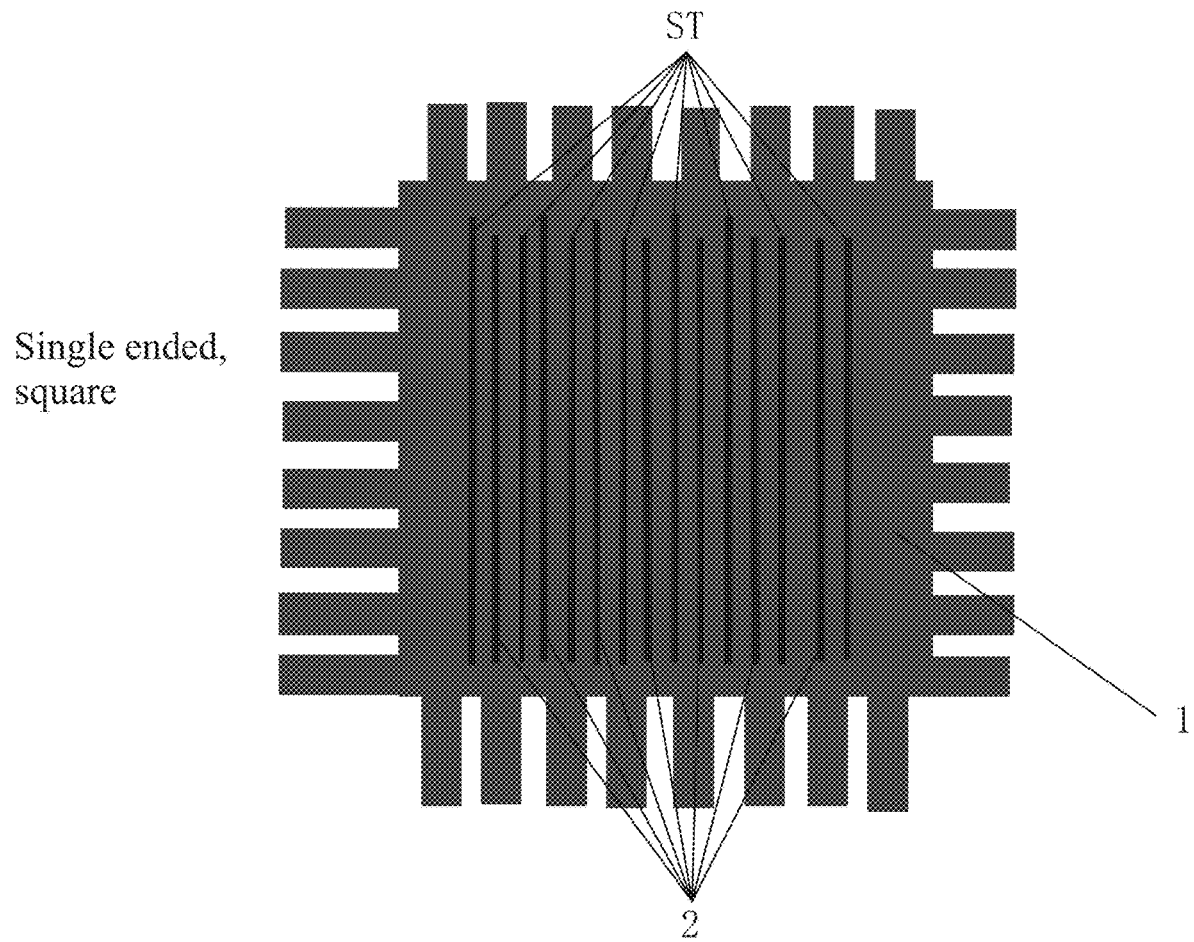
FIG. 10 is a top view of a comb-drive device provided by another embodiment of the present invention.

In an embodiment, as shown in FIG. 10, which illustrates a top view of a comb-drive device provided by an embodiment of the present invention, the rotor body has a square shape, and the comb-drive device is configured for single ended output. In this embodiment, a projection of each of the plurality of rotor combs 2 onto a plane of the rotor body 1 is parallel to a perimeter of the rotor body 1, and a projection of each of the plurality of stator combs 4 onto the plane of the rotor body 1 is parallel to a perimeter of the rotor body 1.

Figure 11A:
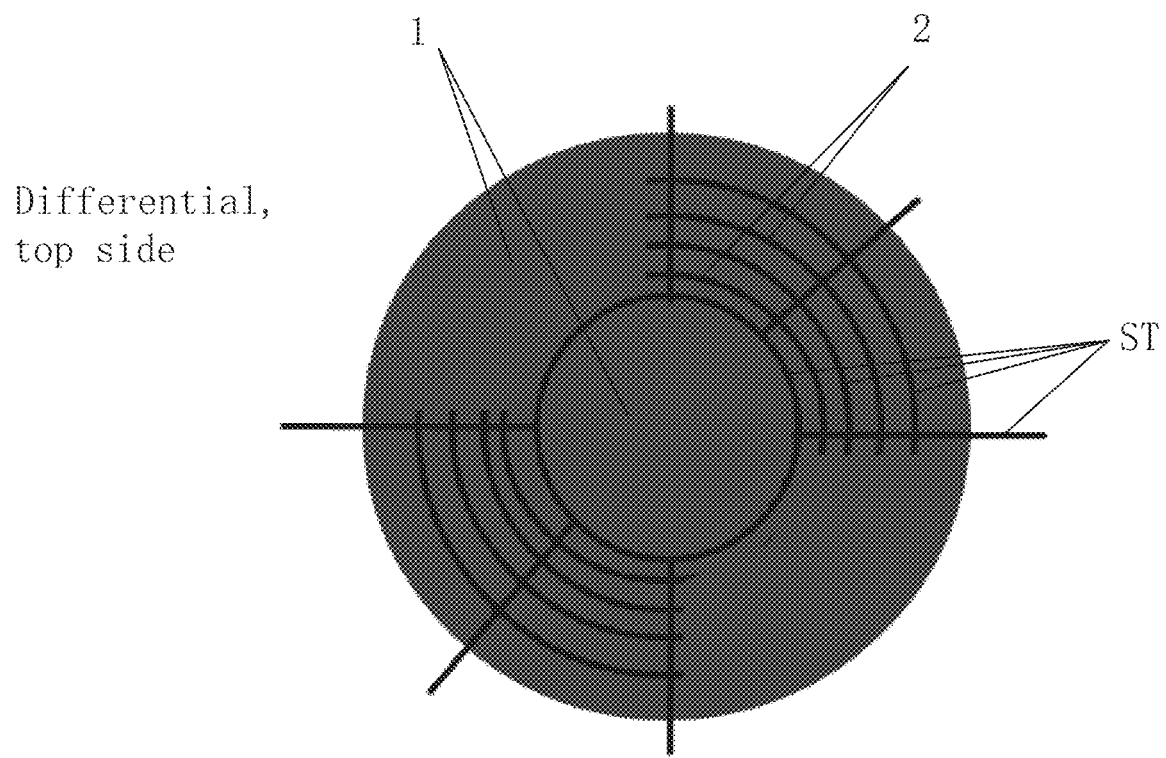
FIG. 11A is a top view of a comb-drive device provided by another embodiment of the present invention.
Figure 11B:
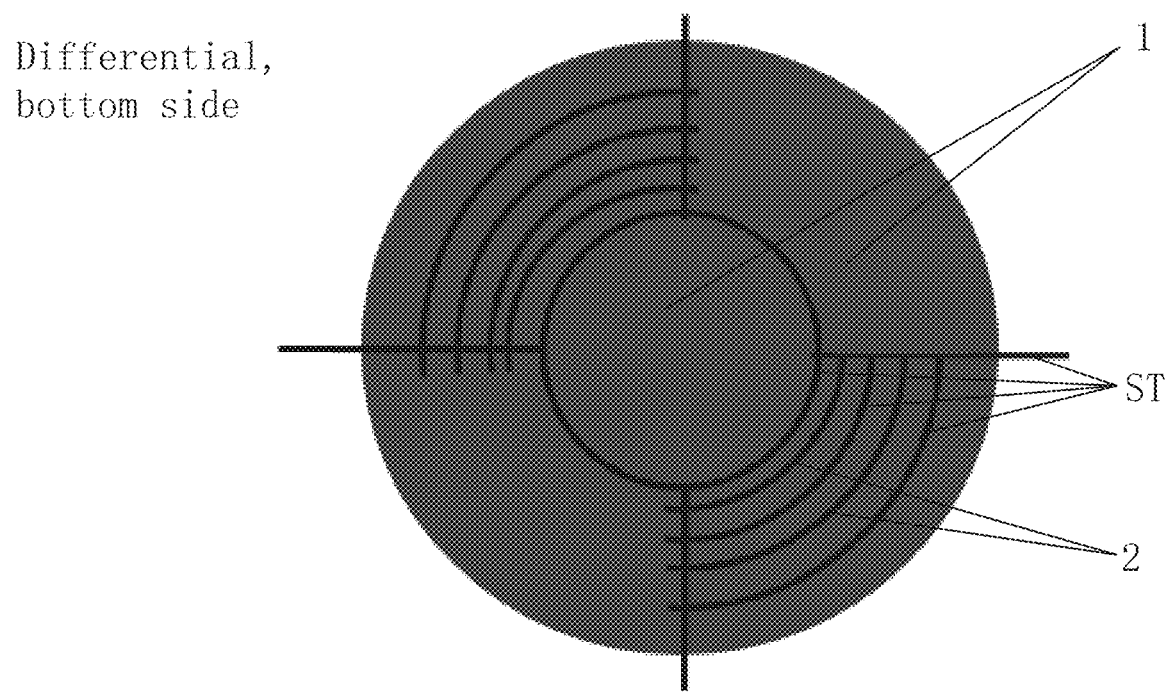
FIG. 11B is a bottom view of a comb-drive device provided by another embodiment of the present invention.

In an embodiment, as shown in FIG. 11A and FIG. 11B, which respectively illustrate a top view and a bottom view of a comb-drive device provided by an embodiment of the present invention, the rotor body has a circular shape, and the comb-drive device is configured for differential output. In this embodiment, a projection of each of the plurality of rotor combs 2 onto a plane of the rotor body 1 is parallel to a perimeter of the rotor body 1, and a projection of each of the plurality of stator combs 4 onto the plane of the rotor body 1 is parallel to a perimeter of the rotor body 1 or follows a radius of the rotor body 1.

Figure 12:
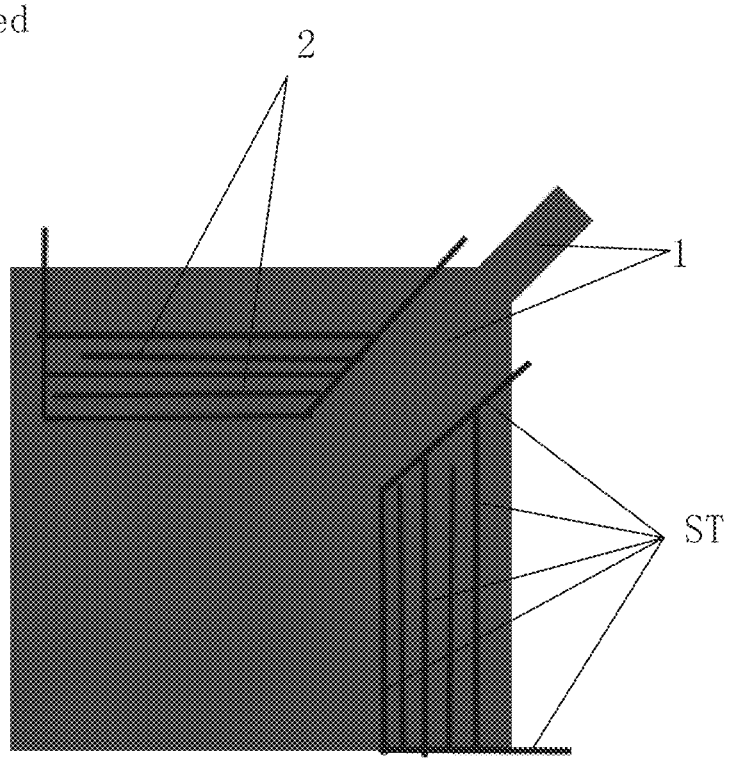
FIG. 12 is a top view of a comb-drive device provided by another embodiment of the present invention.

In an embodiment, as shown in FIG. 12, which illustrates a top view of a comb-drive device provided by an embodiment of the present invention, the comb-drive device is a current microphone diaphragm, and the current microphone diagram is configured for single ended output. In this embodiment, a projection of each of the plurality of rotor combs 2 onto a plane of the rotor body 1 is parallel to a perimeter of the rotor body 1, and a projection of each of the plurality of stator combs 4 onto the plane of the rotor body 1 is parallel to a perimeter of the rotor body 1.

In the above-mentioned embodiments, by arranging the combs in such a manner that a projection of each comb runs parallel to the perimeter of the rotor body 1, mechanical compliance of the device can be maximized, thereby ensuring a high sensitivity output.

With the above-mentioned comb-drive device, the present invention can bring the following benefits. 1) By isolating and segregating the comb pairs, it becomes possible to realize differential sensing since sections of combs on the same rotor body 1 or stator body 3 can be biased to different polarities and magnitudes from each other. 2) By isolating and segregating the comb pairs, an electrostatic field is formed only in a gap between combs and not in the diaphragm above or below the combs, therefore, an electrostatic force is formed only in a direction that is perpendicular to a displacement direction of the diaphragm, so a larger electrostatic force can be applied through a larger bias without causing device failure due to pull in instabilities. 3) The material of the rotor body 1 has high yield strength, thereby increasing a margin of safety for mechanical reliability significantly. 4) Multiple materials are used for different elements: the rotor body 1, the rotor combs 2, the stator body 3 and the stator combs 4, therefore, a larger scope is made for choosing the materials, thereby optimizing their complimentary qualities in process (for example, choosing materials with high etch selectivity with respect to each other). 5) By arranging the combs in such a manner that a projection of each comb runs parallel to the perimeter of the rotor body 1, mechanical compliance of the device can be maximized, thereby ensuring a high sensitivity output. 6) With only the combs biased, there is far less stray, parasitic capacitance. Therefore, sensitivity and capacitance efficiency is increased.

In order to make the purposes, features and advantages of the present invention more understandable, the present invention will be further described with reference to the accompanying drawings and embodiments. However, the embodiments may be implemented in many manners and should not be construed as limited to the embodiments provided herein; these embodiments are provided so that the present disclosure will be understandable, and will better deliver the concepts of the embodiments to those skilled in the art. The expressions about the positions and directions in the present invention are all described by taking the drawings as examples, however, changes may be made if necessary, and all these changes should be included in the protection scope of the present invention. The drawings of the present invention are merely for illustrating a relative position relationship, and the layer thicknesses of some portions are exaggerated for the sake of comprehension, and the layer thicknesses in the drawings do not represent the proportional relationship of the actual layer thicknesses. The embodiments in the present invention and the features in the embodiments may be combined with each other. The drawings of the embodiments in the present application use the same reference signs. In addition, the common feathers of the embodiments will not be repeated herein.

It should be noted that, the above-described embodiments are merely exemplary embodiments of the present invention and are not intended to limit the present invention. Any modifications, equivalent substitutions and improvements made within the principle of the present invention shall fall into the protection scope of the present invention.

What is claimed is:

1. A comb-drive device used in Micro Electro Mechanical System, wherein the device comprises:
   a rotor comprising a rotor body and a plurality of rotor combs provided on the rotor body; and
   a stator comprising one or more stator bodies and a plurality of stator combs provided on the one or more stator bodies,
   wherein the rotor is spaced from the stator by a distance, the rotor and the stator are arranged along a direction in which the rotor is movable, and the plurality of rotor combs and the plurality of stator combs are alternately arranged in a direction particular to the direction in which the rotor is movable; and the rotor body is made of an insulating material, and each of the plurality of rotor combs is made of a conductive material; each of the one or more stator bodies is made of an insulating material.

2. The device used in Micro Electro Mechanical System as described in claim 1, wherein the insulating material is Silicon Nitride or Silicon Carbide.

3. The device used in Micro Electro Mechanical System as described in claim 1, wherein the conductive material is polysilicon, metal, or titanium nitride.

4. The device used in Micro Electro Mechanical System as described in claim 1, wherein the rotor body is a diaphragm or a cantilever.

5. The device used in Micro Electro Mechanical System as described in claim 1, wherein the conductive material of the one or more stator bodies is different from the conductive material of the rotor combs.

6. The device used in Micro Electro Mechanical System as described in claim 1, wherein the insulating material of the one or more stator bodies is different from the insulating material of the rotor body.

7. The device used in Micro Electro Mechanical System as described in claim 1, wherein each of the plurality of stator combs is made of a conductive material.

8. The device used in Micro Electro Mechanical System as described in claim 7, wherein the conductive material of the plurality of stator combs is different of the conductive material of the rotor combs.

9. The device used in Micro Electro Mechanical System as described in claim 1, wherein a distance between each of the plurality of rotor combs and one stator comb of the plurality of rotor combs adjacent to the rotor comb ranges from 1 μm to 3 μm, a distance between adjacent rotor combs of the plurality of rotor combs ranges from 6 μm to 10 μm, a distance between adjacent stator combs of the plurality of stator combs ranges from 6 μm to 10 μm, and a distance between the rotor body and each of the plurality of stator combs arrange form 3 μm to 6 μm.

10. The device used in Micro Electro Mechanical System as described in claim 1, wherein a projection of each of the plurality of rotor combs onto a plane of the rotor body is parallel to a perimeter of the rotor body or follows a radius of the rotor body.

11. The device used in Micro Electro Mechanical System as described in claim 1, wherein a projection of each of the plurality of stator combs onto a plane of the rotor body is parallel to a perimeter of the rotor body or follows a radius of the rotor body.

12. The device used in Micro Electro Mechanical System as described in claim 1, wherein each of the plurality of stator combs has a width of 3 μm and a height of 5 μm.

* * * * *